United States Patent
Riley et al.

(10) Patent No.: US 7,384,869 B2
(45) Date of Patent: Jun. 10, 2008

(54) PROTECTION OF SILICON FROM PHOSPHORIC ACID USING THICK CHEMICAL OXIDE

(75) Inventors: Deborah J. Riley, Richardson, TX (US); Brian M. Trentman, Sherman, TX (US); Brian K. Kirkpatrick, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 8 days.

(21) Appl. No.: 11/100,530

(22) Filed: Apr. 7, 2005

(65) Prior Publication Data

US 2006/0228904 A1 Oct. 12, 2006

(51) Int. Cl.
*H01L 21/302* (2006.01)
*H01L 21/461* (2006.01)

(52) U.S. Cl. .................. 438/689; 438/700; 438/745; 257/E21.219; 257/E21.229; 257/E21.115; 257/E21.117; 257/E21.545

(58) Field of Classification Search ............... 438/689, 438/700, 723, 724, 743, 745, 752, 753, 636, 438/931, 933
See application file for complete search history.

(56) References Cited

U.S. PATENT DOCUMENTS

| | | | | |
|---|---|---|---|---|
| 5,891,784 A * | 4/1999 | Cheung et al. | ............. | 438/303 |
| 6,365,465 B1 * | 4/2002 | Chan et al. | ................. | 438/283 |
| 6,413,802 B1 * | 7/2002 | Hu et al. | .................... | 438/151 |
| 6,498,080 B1 * | 12/2002 | Chittipeddi et al. | ........ | 438/585 |
| 6,750,117 B1 * | 6/2004 | Hung et al. | ................. | 438/437 |
| 6,835,609 B1 * | 12/2004 | Lee et al. | ................... | 438/183 |
| 6,902,939 B2 * | 6/2005 | Moise et al. | ................... | 438/3 |
| 6,921,721 B2 * | 7/2005 | Kirkpatrick et al. | ........ | 438/706 |
| 7,081,387 B2 * | 7/2006 | Furukawa et al. | .......... | 438/258 |
| 7,105,889 B2 * | 9/2006 | Bojarczuk, Jr. et al. | .... | 257/324 |

\* cited by examiner

*Primary Examiner*—David Nhu
(74) *Attorney, Agent, or Firm*—Jacqueline J. Garner; W. James Brady, III; Frederick J. Telecky, Jr.

(57) ABSTRACT

A method for protecting exposed silicon from attack by phosphoric acid during wet etching and stripping processes is provided. According to various embodiments of the method, a thick chemical oxide layer can be formed on the exposed silicon to protect the exposed portion from etching by phosphoric acid. The method can include exposing the silicon to at least one of a hot ozonated sulfuric acid and a hot peroxide sulfuric acid to form the thick chemical oxide.

17 Claims, 3 Drawing Sheets

US 7,384,869 B2

PROTECTION OF SILICON FROM PHOSPHORIC ACID USING THICK CHEMICAL OXIDE

FIELD OF THE INVENTION

The present invention relates to semiconductor devices and etching processes in methods for making semiconductor devices. More particularly, the present invention relates to semiconductor devices and methods for using a thick chemical oxide to protect exposed silicon from a phosphoric acid etch during the manufacturing of semiconductor devices.

BACKGROUND OF THE INVENTION

Phosphoric acid ($H_3PO_4$) is commonly used in semiconductor processing for a variety of applications including wet etching and stripping of metals and nitrides. For example, in a conventional process for forming a gate stack structure, phosphoric acid is used to strip an inorganic anti-reflective coating (IARC) from the top of the polysilicon gate region. Phosphoric acid is also used to etch a silicon nitride hardmask during a conventional process for forming a shallow trench isolation structure.

Problems arise, however, because phosphoric acid also etches exposed silicon leading to roughening of the silicon surface. Conventional methods for protecting against attack by phosphoric acid include growth of a thermal oxide. Growth of a thermal oxide, however, adds processing complexity and exposes the semiconductor structure to the potentially damaging effects of high temperature processing. Furthermore, controlling the growth of thermal oxide thickness is difficult for thin films, and growing of thick thermal oxide films consumes large amounts of silicon and alters critical dimensions (CD).

Another conventional method for protecting exposed silicon against attack by phosphoric acid uses a protective film. The protective film, however, is deposited on all semiconductor structure surfaces, not just exposed silicon. As such, processing complexity is increased because the protective film requires subsequent removal.

Thus, there is a need to overcome these and other problems of the prior art and to provide a method to protect silicon from phosphoric acid.

SUMMARY OF THE INVENTION

According to various embodiments, the present teachings include a method of forming a semiconductor device including etching a first layer to form an exposed portion, wherein the first layer comprises silicon. A thick chemical oxide layer can be formed on the exposed portion, wherein the thick chemical oxide layer protects the exposed portion from etching by phosphoric acid. At least a portion of a second layer can then be removed using a hot phosphoric acid etch, wherein the second layer is disposed over portions of the first layer.

According to various embodiments, the present teachings also include a method for forming a shallow trench isolation structure. In the method, the trench can be formed in a substrate. The trench can then be exposed to at least one of an ozonated sulfuric acid and a peroxide sulfuric acid so as to form a thick chemical oxide layer within the trench.

According to various embodiments, the present teachings further include a method of forming a transistor gate structure. In the method, a layered structure can be formed that includes a hardmask, a gate material disposed on the hardmask, and a gate dielectric layer disposed on the gate material. The hardmask, the gate material, and the gate dielectric layer can be etched to form a gate structure. A thick chemical oxide layer can then be formed on exposed portions of the gate material by exposing the gate structure to a heated oxidizing solution. A wet chemical process can be performed to remove the hardmask.

According to various embodiments, the present teachings further include a semiconductor structure. The semiconductor structure can include a semiconductor substrate and a trench formed in the semiconductor substrate. The semiconductor structure can further include a trench liner formed within the trench, wherein the trench liner comprises a thick chemical oxide, and wherein the trench liner is present prior to a trench being filled.

According to various embodiments, the present teachings further include another semiconductor structure. A semiconductor structure includes a semiconductor substrate. A gate stack can be disposed on the semiconductor substrate, wherein the gate stack has a dielectric layer on the substrate, a silicon layer on the dielectric layer, and a hardmask layer on the silicon layer. The semiconductor structure further includes a thick chemical oxide disposed on an exposed portion of the substrate and on an exposed sidewall portion of the silicon layer.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
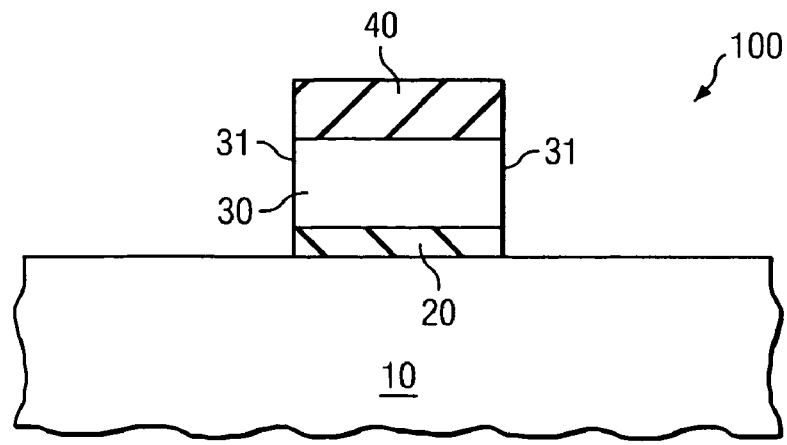
FIG. 1 depicts a method of forming a gate stack structure according to various embodiments of the present teachings.

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, not to be taken in a limited sense.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

As used herein and unless otherwise specifed, the term "silicon" refers to all forms of silicon, including but not limited to, single crystalline, crystalline, poly silicon and amorphous silicon, and certain compounds of silicon, including but not limited to, silicon germanium (SiGe) and silicon carbide (SiC).

FIGS. 1 through 9 depict exemplary semiconductor devices and methods for forming exemplary semiconductor devices that include a thick chemical oxide layer to protect exposed silicon from etching by phosphoric acid. As used herein, the term "thick chemical oxide" refers to a chemical oxide having a density and/or thickness sufficient to protect an underlying layer from etching by phosphoric acid. A phosphoric acid etch can be, for example, about 82-92% phosphoric acid at a temperature of about 140-180° C. The thick chemical oxide can be formed by a self-limiting process that results in a consistent layer that withstands attack by hot phosphoric acid. Moreover, because the thick chemical oxide can be grown using standard semiconductor chemistries and equipment, processing of this protective layer can be easily integrated into the process flow.

In various embodiments, a thick chemical oxide layer, such as, for example, a silicon dioxide layer, can be formed on exposed portions of a silicon layer by exposing the silicon layer to a hot ozonated sulfuric acid and/or a hot peroxide sulfuric acid. The temperature of the hot ozonated sulfuric acid and/or hot peroxide sulfuric acid can be, for example, 80° C. or more. In various embodiments, exposure can be sufficient to form a thick chemical oxide having a thickness of 10 Å or more.

The density of the thick chemical oxide should be sufficient to withstand attack from hot phosphoric acid. For example, in various embodiments, the thick chemical oxide should be able to protect an underlying layer from attack by a hot phosphoric acid of 92% concentration at 180 degrees for at least 60 minutes. According to various embodiments, the density of the thick chemical oxide can be greater than the density of an SC-1 oxide formed on a comparable silicon layer. An SC-1 oxide can be formed, for example, by exposing the silicon layer to a 1:1:20 solution of $NH_4OH$: $H_2O_2$:deionized $H_2O$ for about 10 minutes at about 25° C.

During the exposure, the $H_2O_2$ promotes formation of an oxide layer, while the $NH_4OH$ slowly etches the oxide layer. As a result, a thin chemical oxide layer can be formed on the silicon layer. The resultant SC-1 oxide layer, however, does not have sufficient density to protect against attack from a hot phosphoric acid etch.

An exemplary method for forming a thick chemical oxide to protect exposed silicon from etching by hot phosphoric acid will now be described with reference to a gate etch. Referring to FIG. 1, a gate stack structure 100 can include a dielectric layer 20 formed on a substrate 10. Substrate 10 can be, for example, a silicon substrate. In various embodiments, dielectric layer 20 can be, for example, a gate oxide layer. A silicon layer 30 can be disposed on dielectric layer 20. According to various embodiments, silicon layer 30 can be a doped or undoped, polysilicon layer or an amorphous silicon layer. A hardmask 40 can be disposed over silicon layer 30. In various embodiments, hardmask 40 can be an anti-reflective coating (ARC), such as, for example, an inorganic anti-reflective coating (IARC). In various embodiments, the IARC can be a silicon oxynitride (SiON), silicon rich nitride (SRN), or a stack comprising one or more layers of SiON and SRN.

Figure 2:
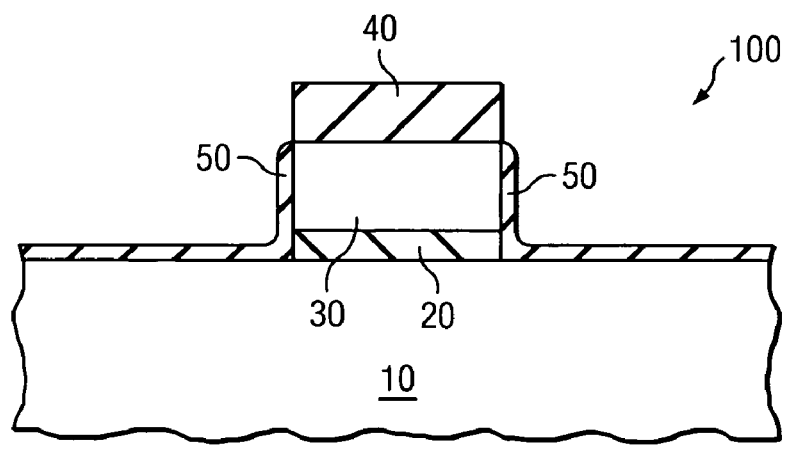
FIG. 2 depicts a method of forming a thick chemical oxide on exposed silicon of in a gate stack structure according to various embodiments of the present teachings.

FIG. 1 depicts a gate stack structure 100 after patterning and etching of silicon layer 30 and dielectric layer 20 using conventional lithographic methods. As shown in FIG. 1, IARC 40 can remain on top of the gate region formed by silicon layer 30 leaving sides 31 of silicon layer 30 exposed. Exposed sides 31 of silicon layer 30 are now susceptible to etching by hot phosphoric acid during removal or pulling back of IARC 40. According to various embodiments, exposed sides 31 of silicon layer 30 can be exposed to a hot ozonated sulfuric acid etch to form a thick chemical oxide 50 on exposed sides 31 as shown in FIG. 2. According to various other embodiments, exposed sides 31 of silicon layer 30 can be exposed to a hot peroxide sulfuric acid etch to form thick chemical oxide 50 on exposed sides 31.

Figure 3:
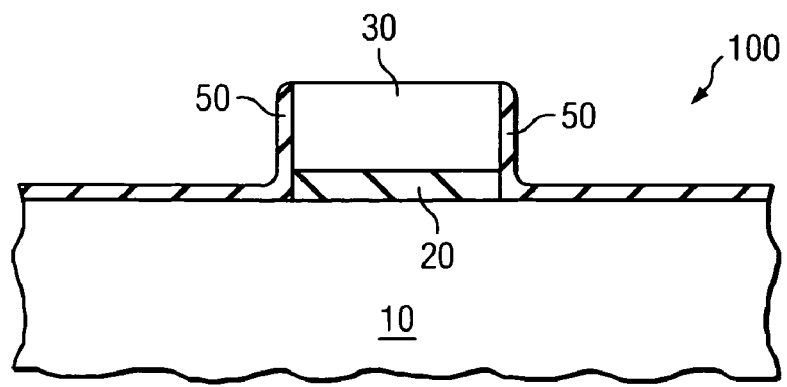
FIG. 3 depicts a method of removing a hardmask using a thick chemical oxide to protect exposed silicon in a gate stack structure according to various embodiments of the present teachings.

Referring to FIG. 3, IARC 40 can then be removed using a hot phosphoric acid. Thick chemical oxide layer 50, however, resists attack by the hot phosphoric acid and, thus, protects sides 31 of silicon layer 30 from etching. In various embodiments, thick chemical oxide layer 50 can remain on sides 31 of silicon layer during subsequent processing. In various other embodiments, thick chemical oxide layer 50 can be removed before further processing by conventional methods including dry etching, wet etching, plasma etching, and abrading.

Figure 4:
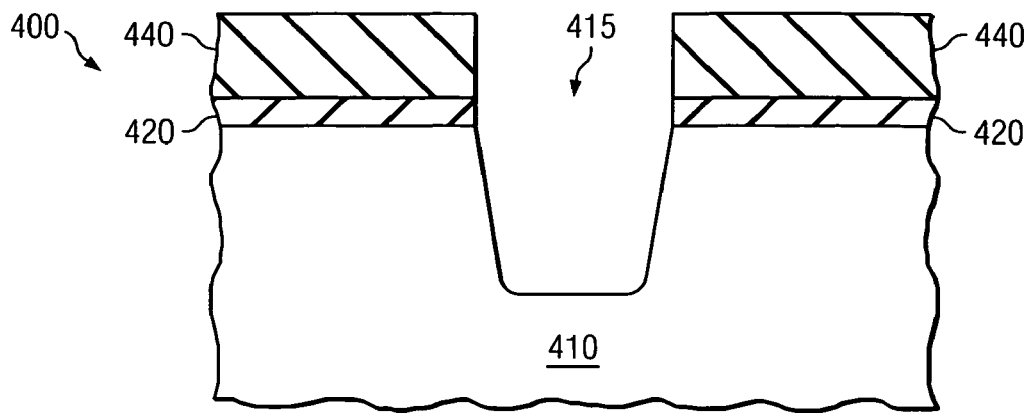
FIG. 4 depicts a method of forming a shallow trench isolation structure according to various embodiments of the present teachings.

Other exemplary methods for forming a thick chemical oxide to protect exposed silicon from etching by hot phosphoric acid will now be described with reference to a shallow trench isolation (STI) process. Referring to FIG. 4, an STI structure 400 can include a pad oxide layer 420 on a semiconductor substrate 410. Substrate 410 can be, for example, silicon. A hardmask 440 can reside on pad oxide 420. Hardmask 440 can be, for example, a nitride, such as silicon nitride. FIG. 4 depicts STI structure 400 after semiconductor substrate 410 has been patterned and etched to form a trench 415.

At this point in a convention STI process, phosphoric acid is used to pull back a small amount of hardmask 440 from over the trench rim to expose a portion of pad oxide 420. As shown in FIG. 4, however, during this "pullback" process the sidewalls and bottom of trench 415 are exposed to etching by the phosphoric acid.

According to various embodiments of the present teachings, a thick chemical oxide can be grown on the exposed portion of semiconductor substrate 410 to protect against attack by the phosphoric acid. Referring to FIG. 2, exposed portions of substrate 410 within trench 415 can be exposed to a hot ozonated sulfuric acid etch to form a thick chemical oxide layer 450. According to various other embodiments, exposed portions of substrate 410 within trench 415 can be exposed to a hot peroxide sulfuric acid etch to form thick chemical oxide 450.

Figure 5:
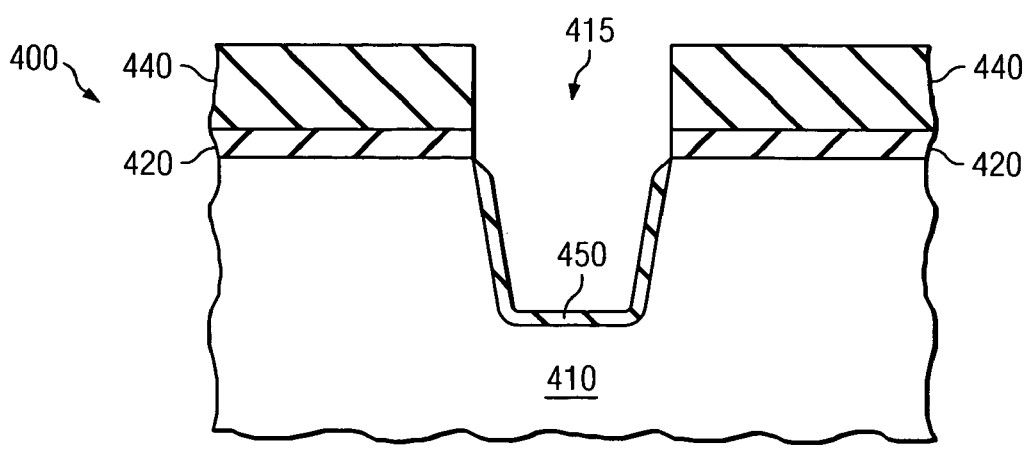
FIG. 5 depicts a method of forming a thick chemical oxide on exposed silicon in a shallow trench isolation structure according to various embodiments of the present teachings.
Figure 6:
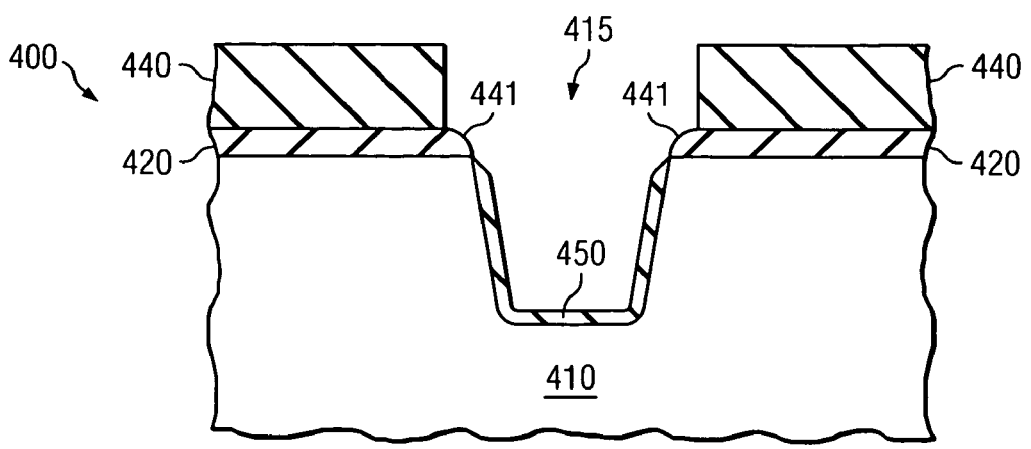
FIG. 6 depicts a method of pulling back a hardmask layer using a thick chemical oxide to protect exposed silicon in a shallow trench isolation structure according to various embodiments of the present teachings.

Phosphoric acid can then be used to pullback of the edges of hardmask 440 to form a pullback region 441 as shown in FIG. 5. Thick chemical oxide layer 450 resists attack by the hot phosphoric acid and, thus, protects exposed portions of substrate 410 within trench 415 from attack by phosphoric acid. In various embodiments, thick chemical oxide layer 450 can remain within trench 415. In various other embodiments, thick chemical oxide layer 450 can be removed by conventional methods, such as, for example, dry etching, wet etching, plasma etching, and abrading.

Figure 7:
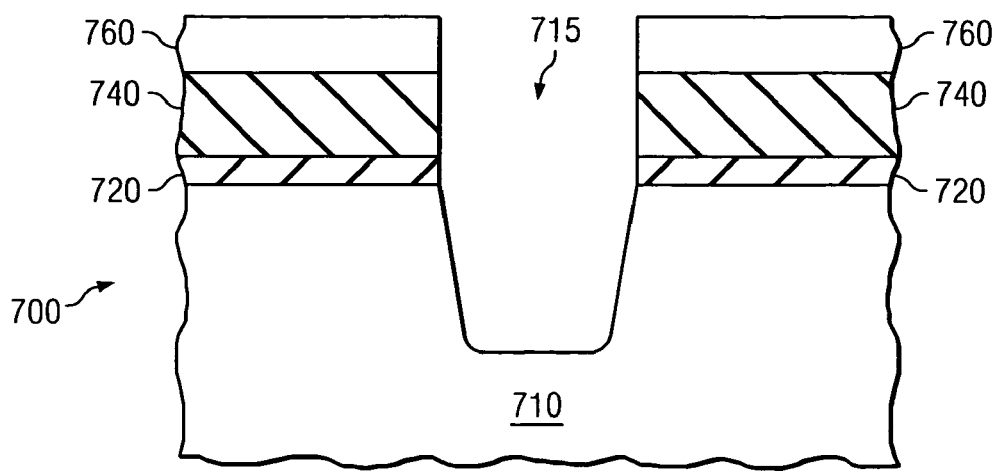
FIG. 7 depicts a method of forming a shallow trench isolation structure according to various embodiments of the present teachings.

According to other embodiments of the present teachings and referring to FIG. 7, an STI structure 700 can include a pad oxide layer 720 on a semiconductor substrate 710. Substrate 710 can be, for example, silicon. A nitride layer 740 can reside on pad oxide 720. Nitride layer 740 can be, for example, silicon nitride. A hardmask 760 can reside on nitride layer 740. FIG. 7 depicts STI structure 700 after semiconductor substrate 710 has been patterned and etched to form a trench 715. In various embodiments, a photoresist layer (not shown) can disposed on hardmask 760.

Figure 8:
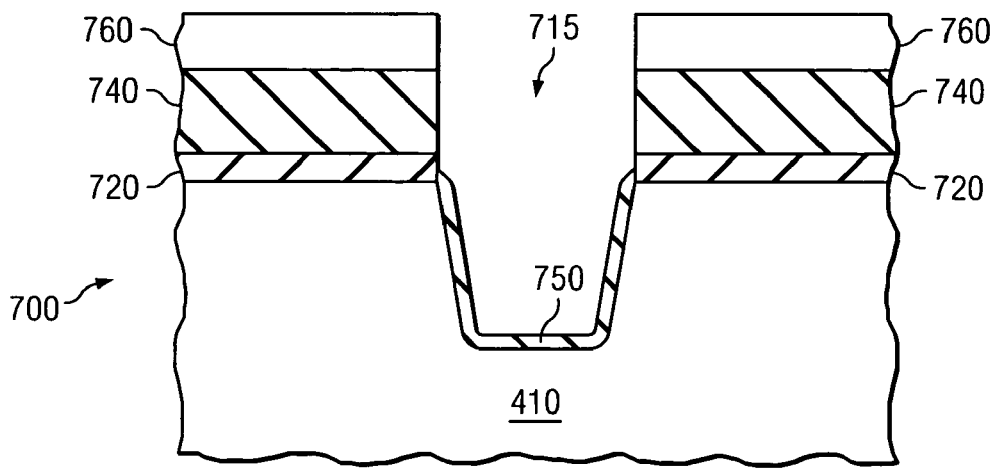
FIG. 8 depicts a method of forming a thick chemical oxide on exposed silicon in a shallow trench isolation structure according to various embodiments of the present teachings.

After removal of the photoresist layer, hardmask 760 can be removed using phosphoric acid. As shown in FIG. 7, however, exposed silicon can exist at the sidewalls and bottom of trench 715. To protect the exposed silicon at the sidewalls and bottom of trench 715, the exposed silicon can be exposed to a hot ozonated sulfuric acid etch to form a trench liner of a thick chemical oxide layer 750 on the sidewalls and the bottom of trench 715 prior to using the hot phosphoric acid to remove hardmask layer 760, as shown in FIG. 8. According to various other embodiments, exposed silicon at the sidewalls and bottom within trench 715 can be exposed to a hot peroxide sulfuric acid etch to form trench liner of thick chemical oxide 750 on the sidewalls and the bottom of trench 715.

Figure 9:
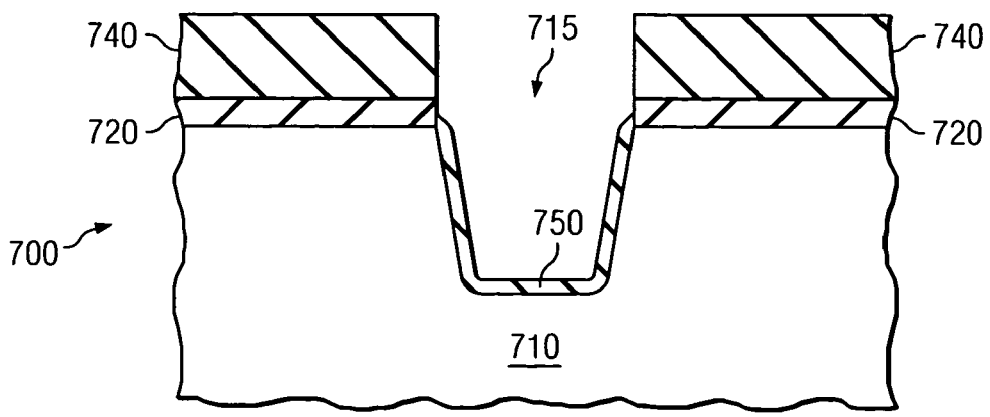
FIG. 9 depicts a method of removing an anti-reflection coating using a thick chemical oxide to protect exposed silicon in a shallow trench isolation structure according to various embodiments of the present teachings.

Phosphoric acid can then be used to remove hardmask layer 760 as shown in FIG. 9. Thick chemical oxide layer 750 resists attack by the phosphoric acid and, thus, protects exposed silicon on the sidewall and the bottom within trench 715 from attack by phosphoric acid. In various embodiments, thick chemical oxide layer 750 can remain within trench 715 during subsequent processing. In various other embodiments, thick chemical oxide layer 750 can be removed before further processing by conventional methods, such as, for example, dry etching, wet etching, plasma etching, and abrading.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

As used herein, the term "one or more of" with respect to a listing of items such as, for example, A and B, means A alone, B alone, or A and B.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a semiconductor device comprising:
   etching a first layer to form an exposed portion, wherein the first layer comprises silicon;
   forming a thick chemical oxide layer on the exposed portion, wherein the thick chemical oxide layer is resistant to etching by phosphoric acid;
   removing at least a portion of a second layer using a hot phosphoric acid etch, wherein the second layer is disposed over portions of the first layer.

2. The method of claim 1, wherein the thick chemical oxide has a density greater than a density of an SC-1 oxide.

3. The method of claim 1, wherein the step of forming a thick chemical oxide layer on the exposed portion comprises exposing the exposed portion of the first layer to one or more of a hot ozonated sulfuric acid or a hot peroxide sulfuric acid.

4. The method of claim 1, wherein the thick chemical oxide layer comprises silicon dioxide.

5. The method of claim 1, wherein the thick chemical oxide layer has a thickness of 10 Å or more.

6. The method of claim 1, wherein the step of removing at least a portion of a second layer using a hot phosphoric acid etch comprises removing edge portions of the second layer comprises silicon nitride.

7. The method of claim 1, wherein the step of removing at least a portion of a second layer using a hot phosphoric acid etch comprises removing a second layer comprising a hardmask.

8. The method of claim 1, further comprising removing the thick chemical oxide layer.

9. A method for forming a shallow trench isolation structure comprising:
   forming a trench in a substrate; and
   exposing the trench to at least one of an ozonated sulfuric acid and a peroxide sulfuric acid so as to form a thick chemical oxide layer within the trench.

10. The method of claim 9, further comprising removing edge portions of a nitride layer using a phosphoric acid etch, wherein the nitride layer is disposed on a pad oxide layer and the pad oxide layer is disposed on the substrate.

11. The method of claim 9, wherein the step of forming a thick chemical oxide layer within the trench comprises forming a silicon dioxide layer on a bottom and a sidewall of the trench.

12. The method of claim 9, further comprising removing a hardmask using a phosphoric acid etch, wherein the hardmask is disposed on a nitride layer, the nitride layer is disposed on a pad oxide layer, and the pad oxide layer is disposed on the substrate.

13. A method of forming a transistor gate structure comprising;
   forming a layered structure including a hardmask, a gate material underlying the hardmask, and a gate dielectric layer underlying the gate material;
   etching the hardmask, the gate material, and the gate dielectric layer to form a gate structure;

forming a thick chemical oxide layer on exposed portions of the gate material by exposing the gate structure to a heated oxidizing solution; and performing a wet chemical process to remove the hardmask.

14. The method of claim 13, wherein the hardmask comprises a silicon oxynitride.

15. The method of claim 13, wherein the step of forming a thick chemical oxide layer on exposed portions of the gate material by exposing the gate structure to a heated oxidizing solution comprises forming a thick silicon dioxide layer by exposing the gate structure to at least one of a hot ozonated sulfuric acid solution and a hot peroxide sulfuric acid solution.

16. The method of claim 13, wherein the thick chemical oxide layer has a thickness of 10Å or more.

17. The method of claim 13, wherein the wet chemical process comprises a hot phosphoric acid etch.

* * * * *